United States Patent
Cao et al.

(10) Patent No.: US 11,183,434 B2
(45) Date of Patent: Nov. 23, 2021

(54) METHODS OF GUIDING PROCESS MODELS AND INSPECTION IN A MANUFACTURING PROCESS

(71) Applicant: ASML NETHERLANDS B.V., Veldhoven (NL)

(72) Inventors: Yu Cao, Saratoga, CA (US); Yi Zou, Foster City, CA (US); Chenxi Lin, Newark, CA (US)

(73) Assignee: ASML Netherlands B.V., Veldhoven (NL)

( * ) Notice: Subject to any disclaimer, the term of this patent is extended or adjusted under 35 U.S.C. 154(b) by 191 days.

(21) Appl. No.: 16/466,665

(22) PCT Filed: Dec. 13, 2017

(86) PCT No.: PCT/EP2017/082524
§ 371 (c)(1),
(2) Date: Jun. 5, 2019

(87) PCT Pub. No.: WO2018/121988
PCT Pub. Date: Jul. 5, 2018

(65) Prior Publication Data
US 2019/0348331 A1  Nov. 14, 2019

Related U.S. Application Data

(60) Provisional application No. 62/439,679, filed on Dec. 28, 2016.

(51) Int. Cl.
*H01L 21/66* (2006.01)
*G03F 7/20* (2006.01)
(Continued)

(52) U.S. Cl.
CPC .............. *H01L 22/20* (2013.01); *G03F 7/705* (2013.01); *G03F 7/70666* (2013.01);
(Continued)

(58) Field of Classification Search
CPC ................ G03F 7/705; G03F 7/70666; G05B 19/41875; G05B 2219/32189;
(Continued)

(56) References Cited

U.S. PATENT DOCUMENTS 5,229,872 A  7/1993 Mumola
5,296,891 A  3/1994 Vogt et al.
(Continued)

FOREIGN PATENT DOCUMENTS

CN  102057329  5/2011
CN  103019027  4/2013
(Continued)

OTHER PUBLICATIONS

Tadao (Computer English Translation of Japanese Patent No. JP-2009-139632A). (Year: 2009).*
(Continued)

*Primary Examiner* — Daniel G Mariam
(74) *Attorney, Agent, or Firm* — Pillsbury Winthrop Shaw Pittman LLP

(57) ABSTRACT

A method where deviations of a characteristic of an image simulated by two different process models or deviations of the characteristic simulated by a process model and measured by a metrology tool, are used for various purposes such as to reduce the calibration time, improve the accuracy of the model, and improve the overall manufacturing process.

21 Claims, 11 Drawing Sheets

(51) Int. Cl.
*G05B 19/418* (2006.01)
*G06T 7/00* (2017.01)

(52) U.S. Cl.
CPC ...... *G05B 19/41875* (2013.01); *G06T 7/0006* (2013.01); *G05B 2219/32189* (2013.01); *G05B 2219/45031* (2013.01); *G06T 2207/10061* (2013.01); *G06T 2207/30121* (2013.01); *G06T 2207/30148* (2013.01); *H01L 22/12* (2013.01)

(58) Field of Classification Search
CPC ........ G05B 2219/45031; G06T 7/0006; G06T 2207/30148; G06T 2207/10061; G06T 2207/30121
USPC ......................................................... 382/141
See application file for complete search history.

(56) References Cited

U.S. PATENT DOCUMENTS

| | | | |
|---|---|---|---|
| 5,523,193 | A | 6/1996 | Nelson |
| 6,046,792 | A | 4/2000 | Van Der Werf et al. |
| 7,587,704 | B2 | 9/2009 | Ye et al. |
| 9,547,745 | B1 * | 1/2017 | Juang .................... G06F 30/398 |
| 2007/0031745 | A1 * | 2/2007 | Ye ........................... G03F 7/705 430/30 |
| 2007/0035712 | A1 | 2/2007 | Gassner et al. |
| 2009/0024967 | A1 | 1/2009 | Su et al. |
| 2009/0157360 | A1 | 6/2009 | Ye et al. |
| 2009/0300573 | A1 * | 12/2009 | Cao .......................... G06F 30/20 716/50 |
| 2011/0010000 | A1 | 1/2011 | Mos et al. |
| 2011/0202298 | A1 | 8/2011 | Izikson et al. |
| 2013/0179847 | A1 | 7/2013 | Hansen |
| 2015/0241790 | A1 | 8/2015 | Pierson et al. |

FOREIGN PATENT DOCUMENTS

| | | |
|---|---|---|
| CN | 103472672 | 12/2013 |
| CN | 103631085 | 3/2014 |
| CN | 104423178 | 3/2015 |
| CN | 104730858 | 6/2015 |
| TW | 201539601 | 10/2015 |

OTHER PUBLICATIONS

International Search Report and Written Opinion issued in corresponding PCT Patent Application No. PCT/EP2017/082524, dated Apr. 6, 2018.

Taiwanese Office Action issued in corresponding Taiwanese Patent Application No. 106145451, dated Oct. 4, 2018.

Chinese Office Action issued in corresponding Chinese patent Application No. 201780081265.0, dated Nov. 16, 2020.

Chinese Office Action issued in corresponding Chinese patent Application No. 201780081265.0, dated Jul. 28, 2021.

* cited by examiner

METHODS OF GUIDING PROCESS MODELS AND INSPECTION IN A MANUFACTURING PROCESS

CROSS-REFERENCE TO RELATED APPLICATIONS

This application is the U.S. national phase entry of PCT Patent Application No. PCT/EP2017/082524, which was filed on Dec. 13, 2017, which claims the benefit of priority of U.S. provisional application no. 62/439,679, which was filed on Dec. 28, 2016, and which is incorporated herein in its entirety by reference.

TECHNICAL FIELD

The description herein relates to methods and systems for process modeling and inspection in a manufacturing process.

BACKGROUND

A lithographic projection apparatus can be used, for example, in the manufacture of integrated circuits (ICs). In such a case, a patterning device (e.g., a mask) may contain or provide a pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic projection apparatus, one target portion at a time. In one type of lithographic projection apparatuses, the pattern on the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), the speed F at which the substrate is moved will be 1/M times that at which the projection beam scans the patterning device. More information with regard to lithographic devices as described herein can be gleaned, for example, from U.S. Pat. No. 6,046,792, incorporated herein by reference.

Prior to transferring the pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

As noted, lithography is a central step in the manufacturing of ICs and other devices, where patterns formed on substrates define functional elements of the ICs or other devices, such as microprocessors, memory chips, etc. Similar lithographic techniques are also used in the formation of flat panel displays, micro-electro mechanical systems (MEMS) and other devices.

As semiconductor manufacturing processes continue to advance, the dimensions of functional elements have continually reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC) in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

SUMMARY

In an aspect, there is provided a method comprising: obtaining a first measured characteristic by measuring a first characteristic of an image physically produced on the substrate under each of a set of processing conditions or at each of a set of locations; obtaining a first simulated characteristic by simulating the first characteristic under each of the set of processing conditions or at each of the set of locations using a first process model; determining a deviation between the first measured characteristic and the first simulated characteristic for each of the set of locations or each of the set of processing conditions; selecting, based on the deviations, a subset of locations from the set of locations or a subset of processing conditions from the set of processing conditions; and adjusting the first process model using data from the subset of locations or under the subset of processing conditions, constructing a second process model using the data, adjusting a condition of a process of forming the image using the data, and/or inspecting for defects at a group of locations on the substrate determined based on the subset of locations or based on the subset of processing conditions.

In an aspect, there is provided a method comprising: at each of a set of locations on a substrate, simulating a first characteristic of an image produced on the substrate using a first process model and using a second process model; determining a deviation between the first characteristic simulated using the first process model and the first characteristic simulated using the second process model at each for the set of locations; selecting, based on the deviations, a subset of locations from the set of locations; and adjusting the first process model using data from the subset of locations, constructing a third process model using the data, adjusting a condition of a process of forming the image using the data, and/or inspecting for defects at a group of locations on the substrate determined based on the subset of locations.

According to an embodiment, the image is an aerial image.

According to an embodiment, the image is a resist image.

According to an embodiment, the image is an etched image.

According to an embodiment, the first characteristic is a critical dimension.

According to an embodiment, the first characteristic is a process window.

According to an embodiment, simulating the first characteristic comprises using the condition.

According to an embodiment, the deviations at the subset of locations are the highest among the deviations at the set of locations.

According to an embodiment, the data comprise a condition of the process of forming the image and a second characteristic measured at the subset of locations.

According to an embodiment, the condition comprises a characteristic of a patterning device used in forming the image.

According to an embodiment, the condition comprises a characteristic of illumination used in forming the image or a characteristic of projection optics used in forming the image.

In an aspect, there is provided a computer program product comprising a non-transitory computer readable medium having instructions recorded thereon, the instructions when executed by a computer implementing a method as described herein.

In an aspect, there is provided a substrate inspection system comprising: a process model training module; a control module; and a simulation module; wherein the process model training module is configured to receive data from a set of locations, and configured to receive a condition of a process of forming an image on a substrate from the control module; wherein the process model training module is configured to construct or modify a first process model based on the data and the condition; wherein the simulation module is configured to simulate characteristics of the image using the first process model, and configured to transmit the simulated characteristics to the control module; wherein the control module is configured to determine deviations between the characteristics simulated using the first process model and the characteristics simulated using a second process model; and wherein the control module is configured to, based on the deviations, adjust the condition, select a subset from the locations, cause inspection of the substrate, and/or cause the process model training module to construct or modify the first process model.

In an aspect, there is provided a substrate inspection system comprising: a process model training module; a control module; and a simulation module; a measurement module; wherein the process model training module is configured to receive data from a set of locations, and configured to receive a condition of a process of forming an image on a substrate from the control module; wherein the process model training module is configured to construct or modify a process model based on the data and the condition; wherein the simulation module is configured to simulate characteristics of the image using the process model, and configured to transmit the simulated characteristics to the control module; wherein the control module is configured to determine deviations between the characteristics simulated using the process model and the characteristics measured on the substrate using the measurement module; and wherein the control module is configured to, based on the deviations, adjust the condition, select a subset from the locations, cause inspection of the substrate, and/or cause the process model training module to construct or modify the process model.

According to an embodiment, the measurement module comprises an optical microscope, a scanning probe microscope, or an electron scanning microscope.

According to an embodiment, the substrate inspection system further comprises a condition adjustment module configured to adjust the condition, and the control module is configured to adjust the condition by the condition adjustment module.

DETAILED DESCRIPTION

Figure 1:
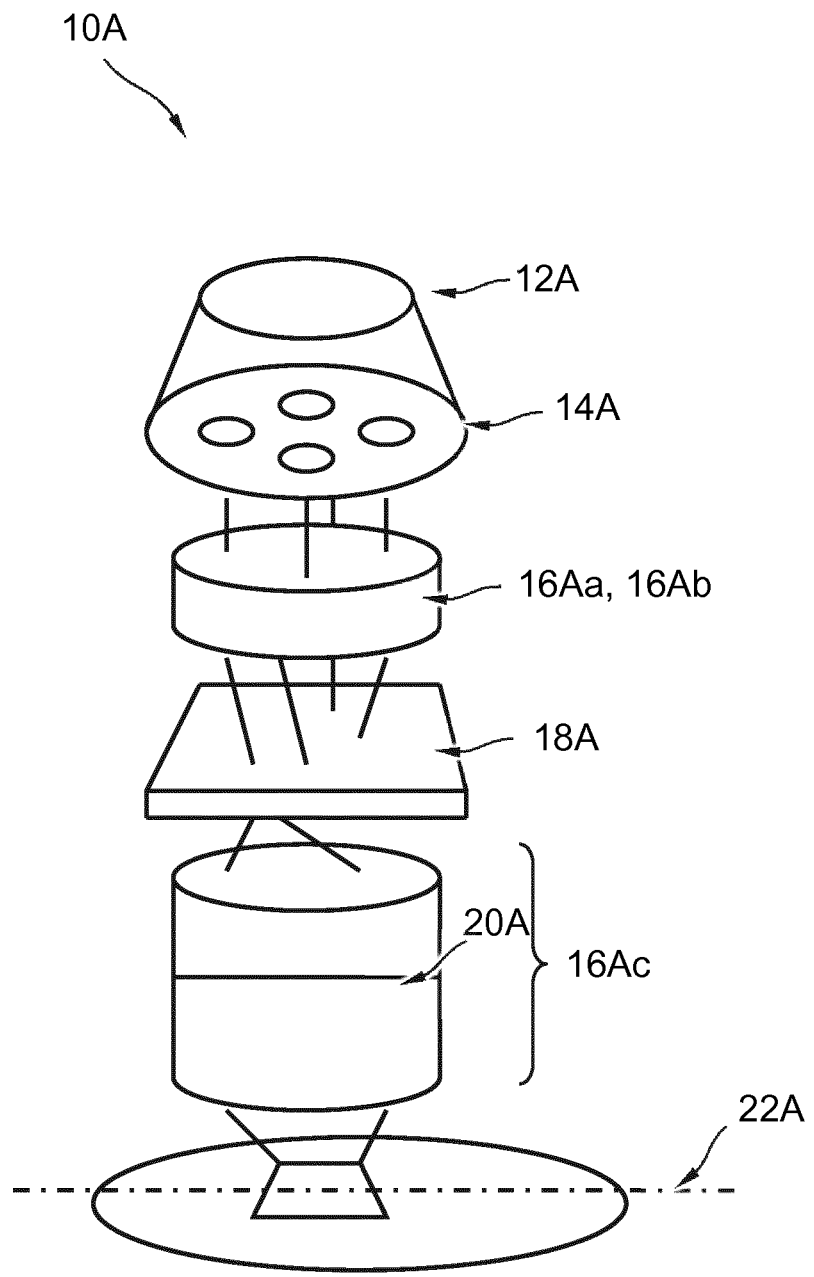
FIG. 1 shows a block diagram of various subsystems of a lithography system.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The patterning device can comprise, or can form, one or more design layouts. The design layout can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. One or more of the design rule limitations may be referred to as "critical dimensions" (CD). A critical dimension can be defined as the smallest width of a line or hole or the smallest space between two lines or two holes. Thus, the CD determines the overall size and density of the designed device. Of course, one of the goals in device (e.g., integrated circuit) fabrication is to faithfully reproduce the original device design on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.

a programmable LCD array. An example of such a construction is given in U.S. Pat. No. 5,229,872, which is incorporated herein by reference.

As a brief introduction, FIG. 1 illustrates an exemplary lithographic projection apparatus 10A. Major components are a radiation source 12A, which may be a deep-ultraviolet excimer laser source or other type of source including an extreme ultra violet (EUV) source (as discussed above, the lithographic projection apparatus itself need not have the radiation source), illumination optics which define the partial coherence (denoted as sigma) and which may include optics 14A, 16Aa and 16Ab that shape radiation from the source 12A; a patterning device 14A; and optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics $NA=n \sin(\Theta_{max})$, n is the index of refraction of the media between the last element of projection optics and the substrate, and $\Theta_{max}$ is the largest angle of the beam exiting from the projection optics that can still impinge on the substrate plane 22A.

In a lithographic projection apparatus, a source provides illumination (i.e. radiation) to a patterning device and projection optics direct and shape the illumination, via the patterning device, onto a substrate. The projection optics may include at least some of the components 14A, 16Aa, 16Ab and 16Ac. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in U.S. Patent Application Publication No. US 2009-0157360, the disclosure of which is hereby incorporated by reference in its entirety. The resist model is related only to properties of the resist layer (e.g., effects of chemical processes which occur during exposure, PEB and development). Optical properties of the lithographic projection apparatus (e.g., properties of the source, the patterning device and the projection optics) dictate the aerial image. Since the patterning device used in the lithographic projection apparatus can be changed, it may be desirable to separate the optical properties of the patterning device from the optical properties of the rest of the lithographic projection apparatus including at least the source and the projection optics.

The term "optimizing" and "optimization" as used herein refers to or means adjusting a lithographic projection apparatus, a lithographic process, etc. such that results and/or processes of lithography have more desirable characteristics, such as higher accuracy of projection of a design layout on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

In an optimization process of a system, a figure of merit of the system can be represented as a cost function. The optimization process boils down to a process of finding a set of parameters (design variables) of the system that optimizes (e.g., minimizes or maximizes) the cost function. The cost function can have any suitable form depending on the goal of the optimization. For example, the cost function can be weighted root mean square (RMS) of deviations of certain characteristics of the system with respect to the intended values (e.g., ideal values) of these characteristics; the cost function can also be the maximum of these deviations (i.e., worst deviation). The design variables of the system can be confined to finite ranges and/or be interdependent due to practicalities of implementations of the system. In the case of a lithographic projection apparatus, the constraints are often associated with physical properties and characteristics of the hardware such as tunable ranges, and/or patterning device manufacturability design rules.

Figure 2:
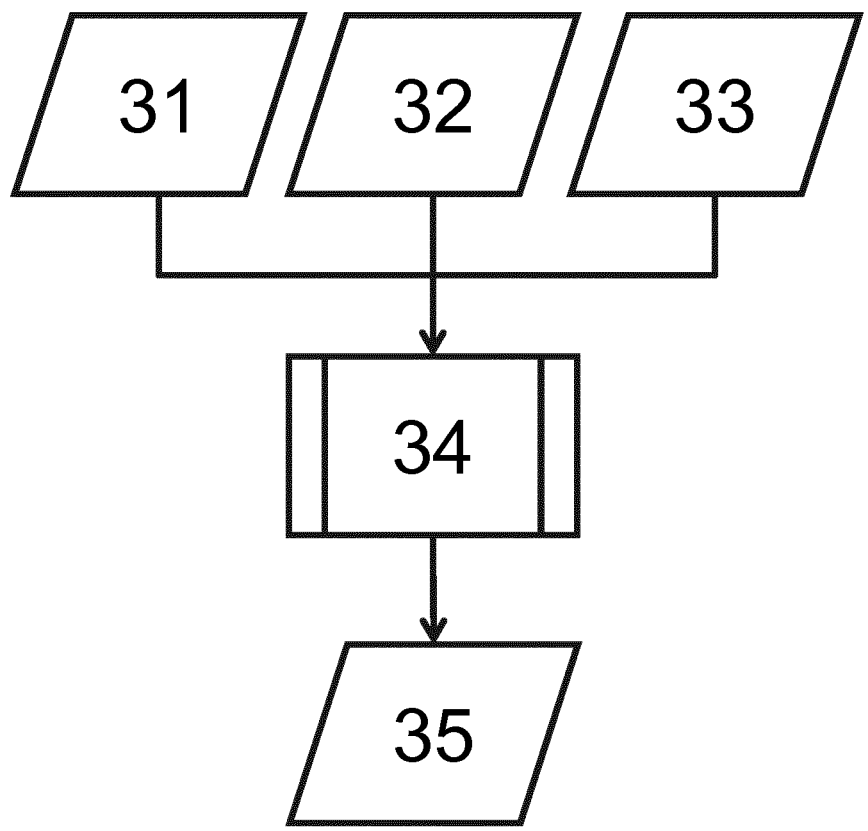
FIG. 2 shows a flow chart for simulating lithography in a lithographic projection apparatus.

An exemplary flow chart for simulating lithography in a lithographic projection apparatus is illustrated in FIG. 2. One or more characteristics 31 (e.g., radiation intensity distribution and/or phase distribution) of the illumination, one or more characteristics 32 (e.g., changes to the radiation intensity distribution and/or to the phase distribution caused by the projection optics) of the projection optics, and one or more characteristics 33 (e.g., changes to the radiation intensity distribution and/or to the phase distribution caused by an arrangement of features on or formed by the patterning device that represent a given design layout) of the patterning device are provided to a process model 34 as inputs thereto. The process model 34 simulates, using these inputs, characteristics (e.g., contours, CDs, etc.) of an image 35 (e.g., an aerial image, a resist image or an etched image).

More specifically, it is noted that the one or more characteristics 31 can include one or more optical characteristics of the illumination including, but not limited to, a numerical aperture setting, an illumination sigma ($\sigma$) setting, and/or a particular illumination shape (e.g. off-axis illumination such as annular, quadrupole, dipole, etc.). The one or more characteristics 32 can include one or more optical characteristics of the projection optics, including aberration, distortion, one or more refractive indices, one or more physical sizes, one or more physical dimensions, etc. The one or more characteristics 33 can include one or more physical properties of a physical patterning device, as described, for example, in U.S. Pat. No. 7,587,704, which is incorporated by reference in its entirety. The simulation can predict, for example, edge placement, aerial image intensity slope, CD and/or a contour, which can then be compared against an intended design. The intended design is generally defined as a pre-OPC design layout which can be provided in a standardized digital file format such as GDSII or OASIS or other file format.

Although the process model 34 can have multiple inputs such as the characteristics 31, 32 and 33, the process model 34 may be used to simulate characteristics of the image 35 when one or more of the inputs are fixed.

In one example, the characteristics 31 and 32 may be fixed, and the process model 34 may be used to simulate one or more characteristics (e.g., CDs) of the image 35 formed by various patterning devices represented by the one or more characteristics 33 (e.g., CDs of the features on or formed by the patterning devices) under the processing conditions represented by the characteristics 31 and 32. The one or more characteristics 33 of the patterning device may be affected by various RET techniques (e.g., OPC). Deviation between the characteristics of the image 35 simulated by the process model 34 and the characteristics of the design layout on or formed by the patterning device may be attributed to errors of the RET techniques when the RET techniques are aimed to minimize this deviation.

In another example, the one or more characteristics 33 may be fixed, and the process model 34 may be used to simulate the one or more characteristics (e.g., CDs) of the image 35 formed by the patterning device represented by the one or more characteristics 33 under various processing conditions represented by the characteristics 31 and 32. The one or more characteristics 31 of the illumination and the one or more characteristics 32 of the projection optics may be affected by various RET techniques (e.g., source optimization or source-projection optics co-optimization). Deviation between the characteristics of the image 35 simulated by the process model 34 and the characteristics of the design layout represented by the patterning device may be attributed to errors of the RET techniques when the RET techniques are aimed to minimize this deviation.

A deviation between the characteristics of the image 35 simulated by the process model 34 and the characteristics of an image physically produced on a substrate under the same processing conditions and same patterning device as those for the simulation of the characteristics of the image 35 using the process model 34 is attributed to an error of the process model 34 because the process model 34 is aimed to minimize this deviation.

Similarly, a deviation between the characteristics of the image 35 simulated by one process model 34 and the deviation between the characteristics of the image 35 simulated by another process model 34 is attributed to the errors of at least one of these process models because accurate process models should produce the same result from the same inputs.

Therefore, deviation between the characteristics of an image physically produced on a substrate using a patterning device and the characteristics of the design layout represented by the patterning device may be attributed to a combination of the errors of the process model 34 and the errors of the RET techniques.

The process model 34 may have one of many possible forms. In each form, the process model 34 may have one or more parameters. The values of the parameters may be determined from a set of data (e.g., by regression). Each of the data may contain values of the inputs of the process model 34 and characteristics of an observed image physically formed on a substrate (or a simulated image) under the processing condition represented by these values of the inputs. For example, the data may include a number of patterns and the images of these patterns formed on a substrate under a number of processing conditions.

Figure 3:
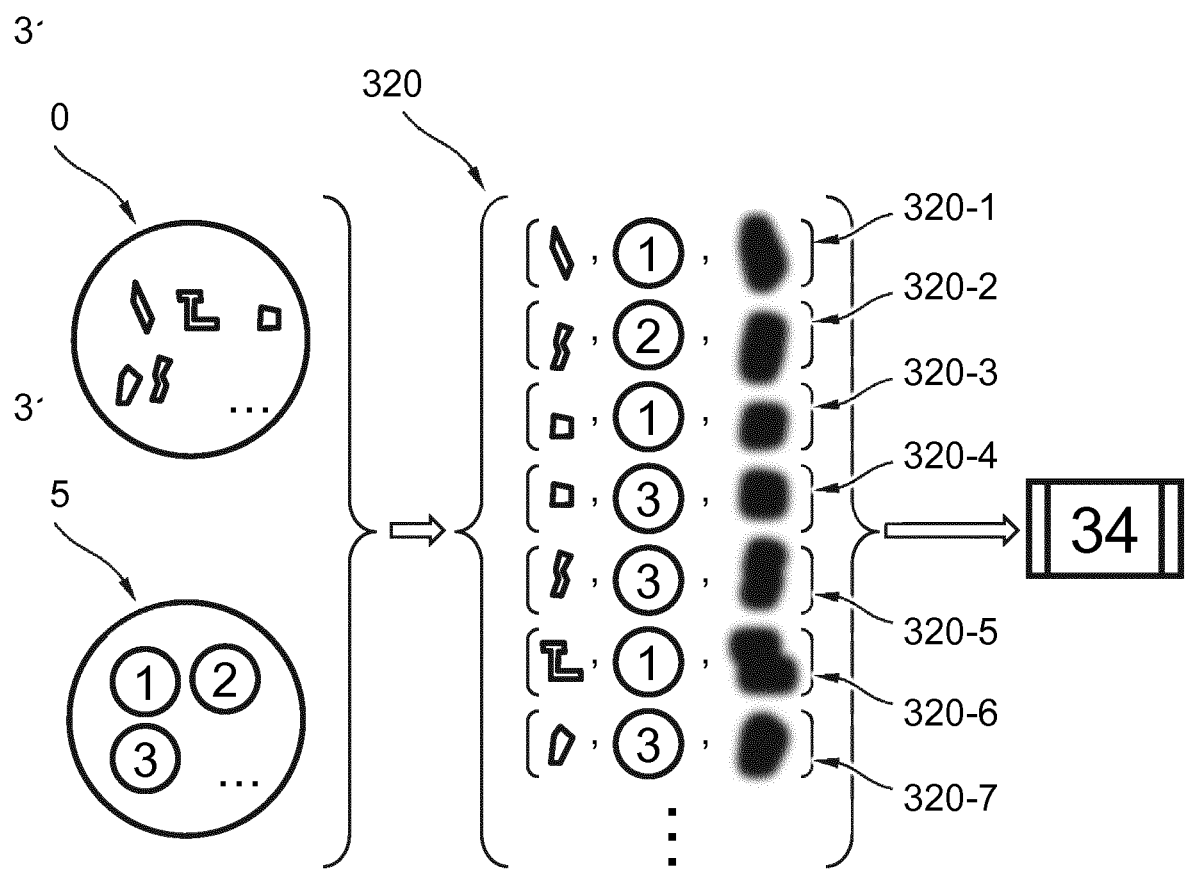
FIG. 3 schematically shows the construction of the process model 34 using a set of data.

FIG. 3 schematically shows the construction of the process model 34 using a set of data. A patterning device can have many patterns 310. These patterns 310 may produce a variety of images on a substrate under a variety processing conditions 315. The same pattern on the patterning device may produce different images on a substrate under different processing conditions. A group of data 320 is selected for constructing the process model 34 (i.e., determining the values of the parameters of the process model 34). Each (e.g., 320-1, 320-2, . . . ) of the data 320 may include a characteristic of a pattern on the patterning device, a characteristic of a processing condition, and a characteristic of an image that the pattern physically produces on a substrate under that processing condition. In the example shown in FIG. 3, it can be observed that the same pattern may product different images under different processing conditions. If the data 320 are not representative of the patterns 310 or the processing conditions 315 (e.g., in the extreme, if the data 320 all have the same processing condition), the process model 34 constructed from the data 320 may have large errors, especially when the process model 34 is used to simulate the characteristics of the image produced by a pattern that is not sufficiently represented in the data 320 or under a processing condition that is not sufficiently represented in the data 320.

Selecting representative data for constructing the process model 34 and assessing the representativeness of a set of data may be difficult because of the large number of patterns on a patterning device and the large number of processing conditions a lithography projection apparatus may have. Increasing the amount of data used in the construction of the process model 34 will certainly improve the representativeness of the data but also will increase the amount of computation needed for the construction.

Figure 4:
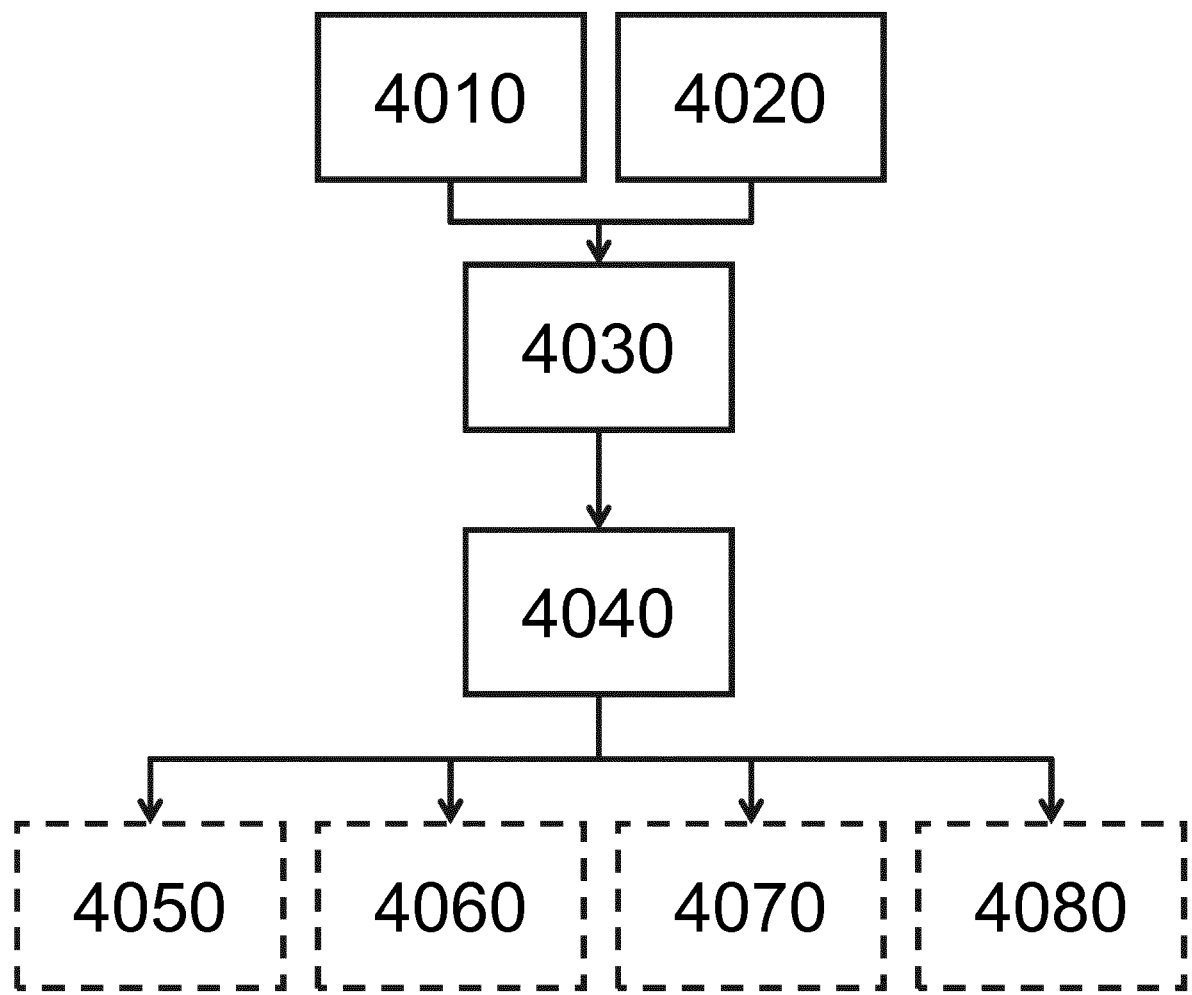
FIG. 4 schematically shows a flow chart of a method, according to an embodiment.

In an embodiment, the deviation between the characteristics ("simulated characteristics") of the image 35 simulated by the process model 34 and the characteristics ("measured characteristics") of an image physically produced on a substrate under the same processing conditions and using the same patterning device as in the simulation may be used as a gauge for the quality of the process model 34 or the representativeness of the data used to construct the process model 34. FIG. 4 schematically shows a flow chart for this embodiment. In procedure 4010, a first measured characteristic is obtained by measuring a first characteristic of the image physically produced on the substrate under each of a set of processing conditions or at each of a set of locations. The image may be an aerial image, a resist image, or an etched image. The first characteristic may be a CD. Other examples of the first characteristic may include a statistical parameter such as a process window. In procedure 4020, a first simulated characteristic is obtained by simulating the first characteristic under each of the set of processing conditions or at each of the set of locations using the process model 34. In procedure 4030, the deviation between the first measured characteristic and the first simulated characteristic is determined for each of the set of locations or each of the set of processing conditions. In procedure 4040, a subset of locations or a subset of processing conditions is selected from the set of locations or the set of processing conditions, respectively, based on the deviations. The subset of locations or the subset of processing conditions may be those having the highest deviations among the set of locations or the set of processing conditions, i.e., the deviation for any location or any processing condition in the subset is higher than any location or processing condition in the set but not in the subset. Here, a deviation being "highest" or "higher" means that the absolute value of the deviation is highest or higher, respectively. The subset of locations includes those locations where the error of the process model 34 is relatively large; the subset of processing conditions includes those processing conditions where the error of the process model 34 is relatively large. The identification of this subset of locations or subset of processing conditions may help the manufacturing process in several aspects. For example, in procedure 4050, the process model 34 may be adjusted using data (e.g., metrology data) from the subset of locations or data (e.g., metrology data) under the subset of processing conditions; in procedure 4060, a new process model may be constructed using data (e.g., metrology data) from the subset of locations or data (e.g., metrology data) under the subset of processing conditions; in procedure 4070, a condition of a process of forming the image (e.g., one or more characteristics of the illumination, the projection optics, the patterning device, or a combination thereof) may be adjusted based on data (e.g., metrology data) from the subset of locations or data (e.g., metrology data) under the subset of processing conditions; and/or in procedure 4080, a group of locations (e.g., locations with the same patterns as the subset of locations) on the substrate determined based on the subset of locations or based on the subset of processing conditions (e.g., locations with patterns produced under the subset of processing conditions) may be inspected (e.g., by measuring a second characteristic of the image and determining its deviation from the second characteristic of the design layout). The second characteristic may be different (e.g., another CD) or the same as the first characteristic. Simulating the first characteristic using the process model 34 in procedure 4020 may use the condition as an input. The data (e.g., metrology data) from the subset of locations or data (e.g., metrology data) under the subset of processing conditions may include a condition of a process of forming the image and the measured second characteristic at the subset of locations or formed under the subset of processing conditions. Adjusting the condition may use an optimization process, e.g., to enlarge the process window to accommodate the error of the process model 34.

Figure 5:
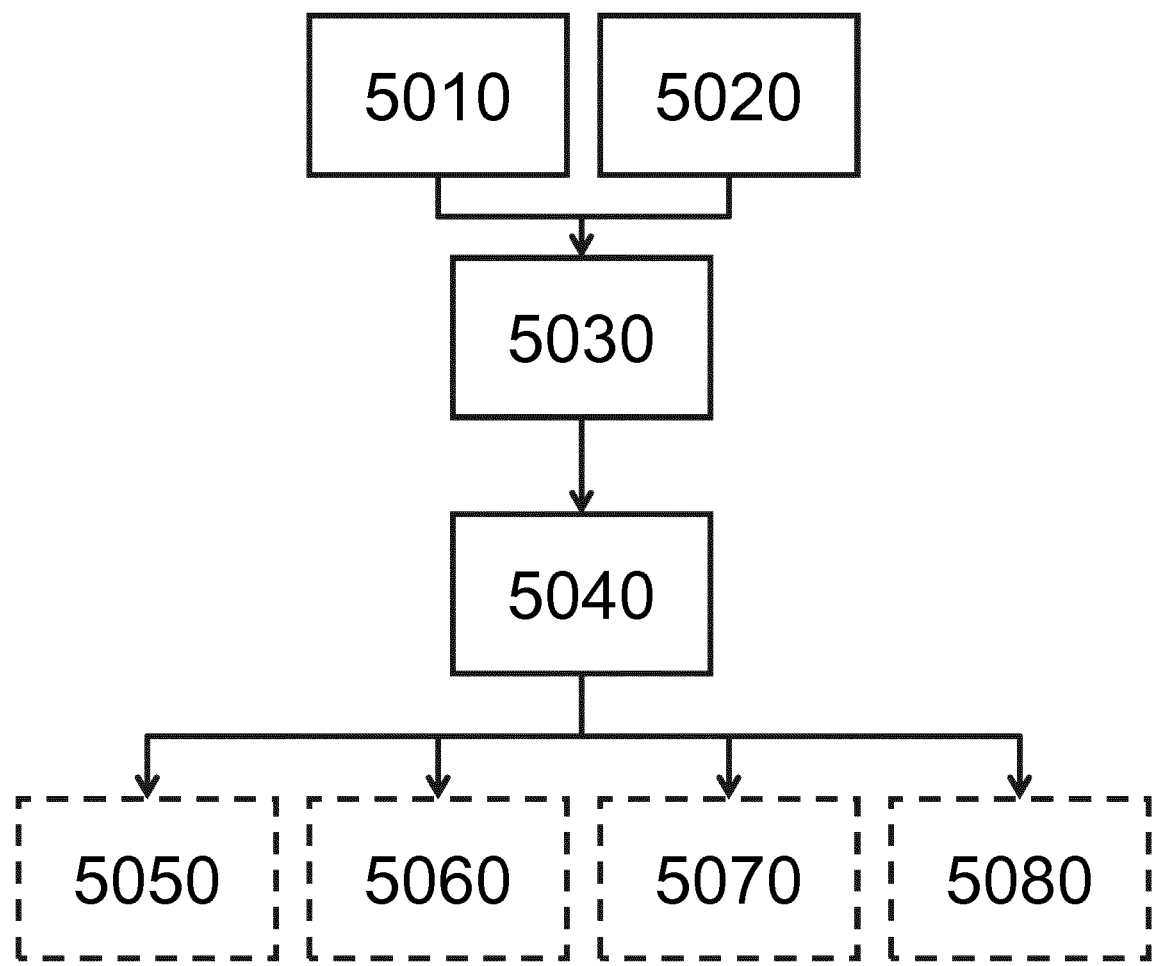
FIG. 5 schematically shows a flow chart of a method, according to an embodiment.

In an embodiment, the deviation between the characteristics of the images simulated by a first process model and a second process model under the same processing conditions and using the same patterning device may be used as a gauge for the quality of either process model. The deviation between the characteristics of the images simulated by a first process model and a second process model under the same processing conditions and using the same patterning device may be a statistical parameter (e.g., standard deviation) of the characteristics of the images simulated by a group of process models including the first process model and the second process model under the same processing conditions and using the same patterning device. FIG. 5 schematically shows a flow chart for this embodiment. In procedure 5010, a first characteristic of an image at each of a set of locations on the substrate is simulated using a first process model. The image may be an aerial image, a resist image, or an etched image. The first characteristic may be a CD. The first characteristic may be other characteristics, for example, a statistical parameter such as a process window. In procedure 5020, the first characteristic of the image at each of the set of locations is simulated using a second process model. The first and second process models may be constructed from the same set of data. The first and second process models may have different forms. In procedure 5030, the deviation between the first characteristic simulated using the first process model and the first characteristic simulated using the second process model is determined for each of the set of locations. In procedure 5040, a subset of locations is selected from the set of locations based on the deviations. The subset of locations may be those having the highest deviations among the set of locations, i.e., the deviation for any location in the subset is higher than any location in the set but not in the subset. Here, a deviation being "highest" or "higher" means that the absolute value of the deviation is highest or higher, respectively. The subset of locations includes those locations where the two process models are relatively less consistent. The identification of this subset of locations may help the manufacturing process in several aspects. For example, in procedure 5050, one or both of the process models may be adjusted using data (e.g., metrology data) from the subset of locations; in procedure 5060, a new process model may be constructed using data (e.g., metrology data) from the subset of locations; in procedure 5070, a condition of a process of forming the image (e.g., one or more characteristics of the illumination, the projection optics, the patterning device, or a combination thereof) may be adjusted based on data (e.g., metrology data) from the subset of locations; and/or in procedure 5080, a group of locations on the substrate determined based on the subset of locations may be inspected for defects (e.g., by measuring a second characteristic of the image and determining its deviation from the second characteristic in the design layout). The second characteristic may be different (e.g., another CD) or the same as the first characteristic. Simulating the first characteristic using the process models in procedure 5010 or 5020 may use the condition as an input. The data (e.g., metrology data) from the subset of locations may include a condition of a process of forming the image and the second characteristic measured at the subset of locations. Adjusting the condition may use an optimization process, e.g., to enlarge the process window to accommodate the inconsistency of the process models.

The subset of locations selected in procedure 5040 may be used as the set of locations in the flow of FIG. 4. Namely, the flow of FIG. 5 may be used before the flow of FIG. 4. The flow of FIG. 5 does not require actually producing a substrate or physical measurements on a substrate. Therefore, when the flow of FIG. 5 is used to select the set of locations for the flow of FIG. 4, the amount of measurement in procedure 4010 may be reduced.

Figure 6:
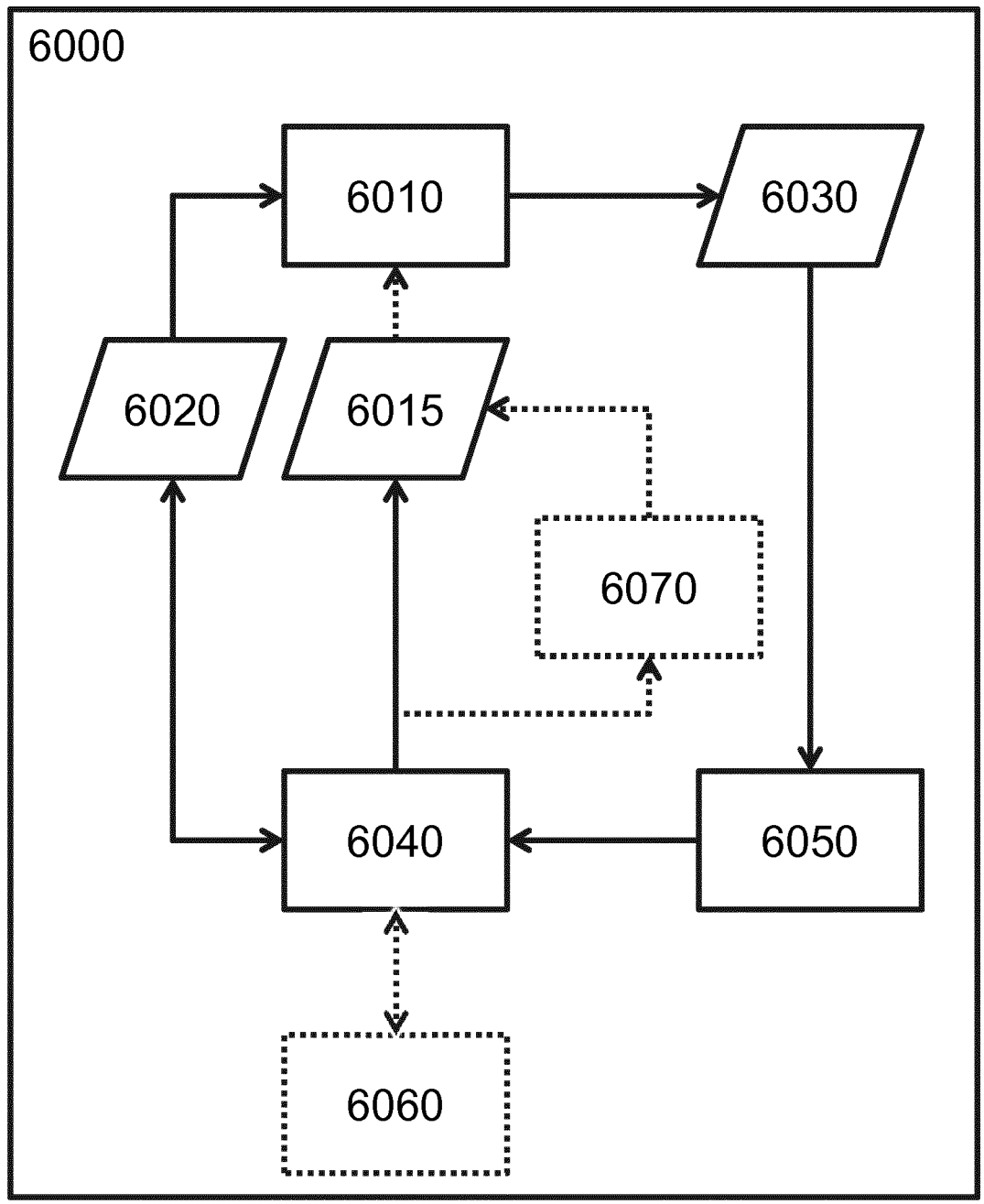
FIG. 6 schematically shows a functional block diagram of a substrate inspection apparatus, according to an embodiment

FIG. 6 schematically shows a functional block diagram of a substrate inspection system 6000 that is capable of performing at least part of the flows of FIG. 4 and FIG. 5. The substrate inspection system 6000 has a process model training module 6010 and a control module 6040. The process model training module 6010 receives data from a plurality of locations 6020. The process model training module 6010 receives a condition 6015 of a process of forming the image on a substrate, from the control module 6040. The process model training module 6010 constructs or modifies one or more process models 6030 based on the data and the condition 6015 (e.g., by regression). The substrate inspection system 6000 has a simulation module 6050. The simulation module 6050 uses one or more of the process models 6030 to simulate characteristics of an image formed on the substrate. The simulation module 6050 transmits the simulated characteristics of the image to the control module 6040. The control module 6040 may determine deviations between the simulated characteristics of the image using one process model and those simulated using another process model. The control module 6040 may determine deviations between the characteristics of the image simulated using a process model and those measured on the substrate with an optional measurement module 6060 of the substrate inspection system 6000. The control module 6040 may adjust the condition 6015 by an optional condition adjustment module 6070, select a subset from the locations 6020, cause the measurement module 6060 to inspect the substrate, or cause the process model training module 6010 to construct or modify the process model 6030, based on these deviations. The measurement module 6060 may include an optical microscope, a scanning probe microscope, an electron scanning microscope, or other suitable metrology instrument. The simulation module 6050, the control module 6040 and the process model training module 6010 may be hardware that includes one or more processors.

Figure 7:
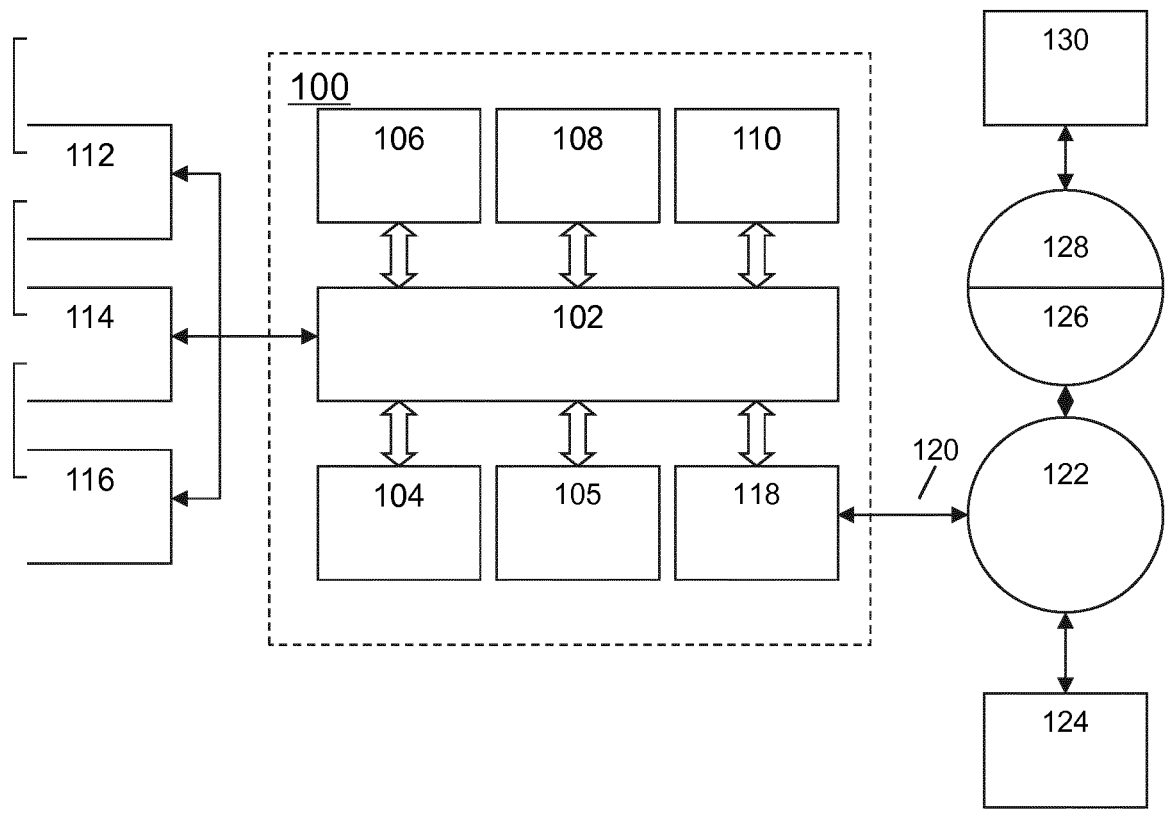
FIG. 7 is a block diagram of an example computer system.

FIG. 7 is a block diagram that illustrates a computer system 100 which can assist in implementing the methods, flows, apparatuses or systems disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of a process herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 8:
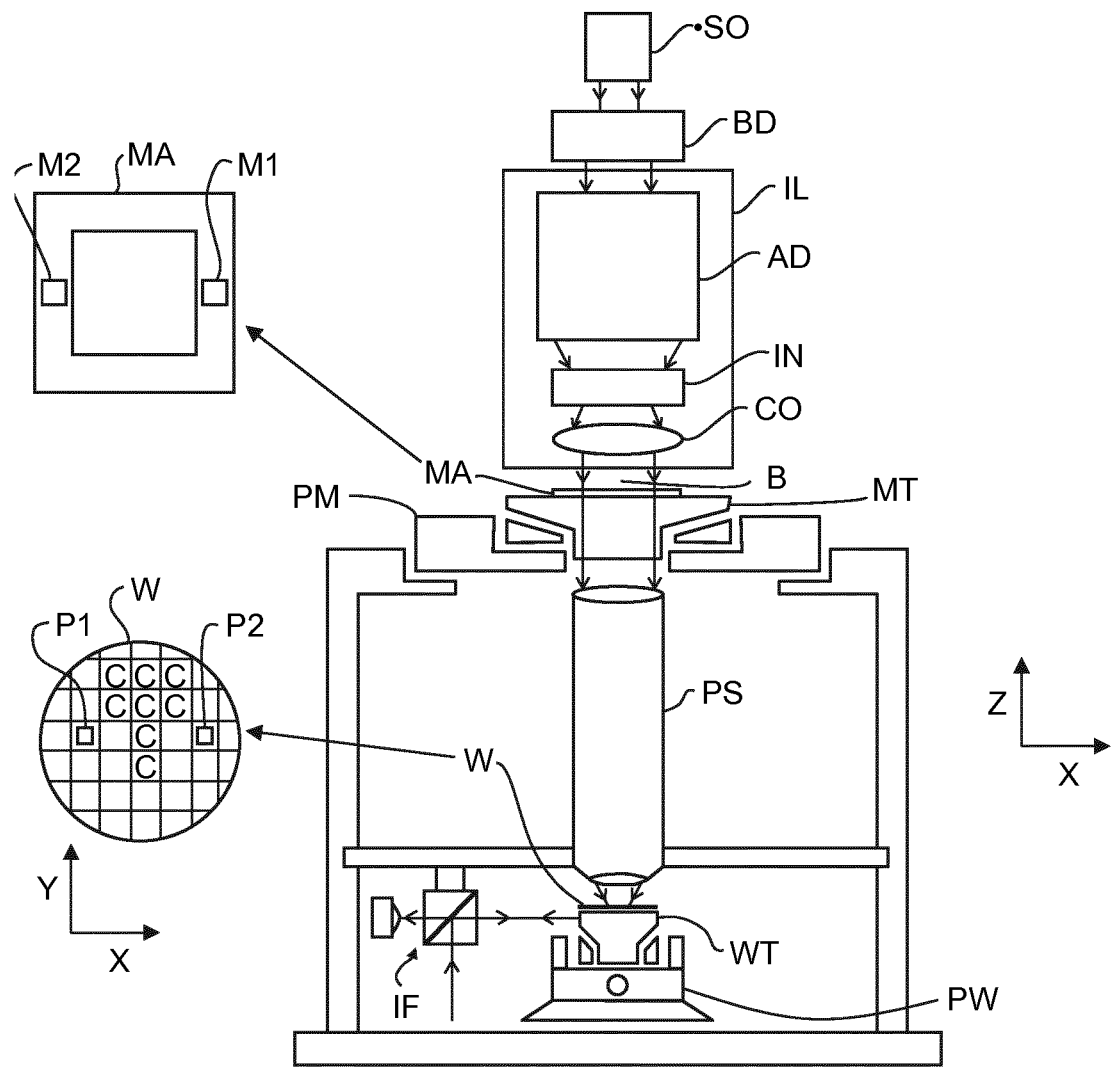
FIG. 8 is a schematic diagram of a lithographic projection apparatus.

FIG. 8 schematically depicts an exemplary lithographic projection apparatus. The apparatus comprises:

an illumination system IL, to condition a beam B of radiation. In this particular case, the illumination system also comprises a radiation source SO;

a first object table (e.g., patterning device table) MT provided with a patterning device holder to hold a patterning device MA (e.g., a reticle), and connected to a first positioner to accurately position the patterning device with respect to item PS;

a second object table (substrate table) WT provided with a substrate holder to hold a substrate W (e.g., a resist-coated silicon wafer), and connected to a second positioner to accurately position the substrate with respect to item PS;

a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 8 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 8. However, in the case of a stepper (as opposed to a step-and-scan tool) the patterning device table MT may just be connected to a short stroke actuator, or may be fixed.

The depicted tool can be used in two different modes:

In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 9:
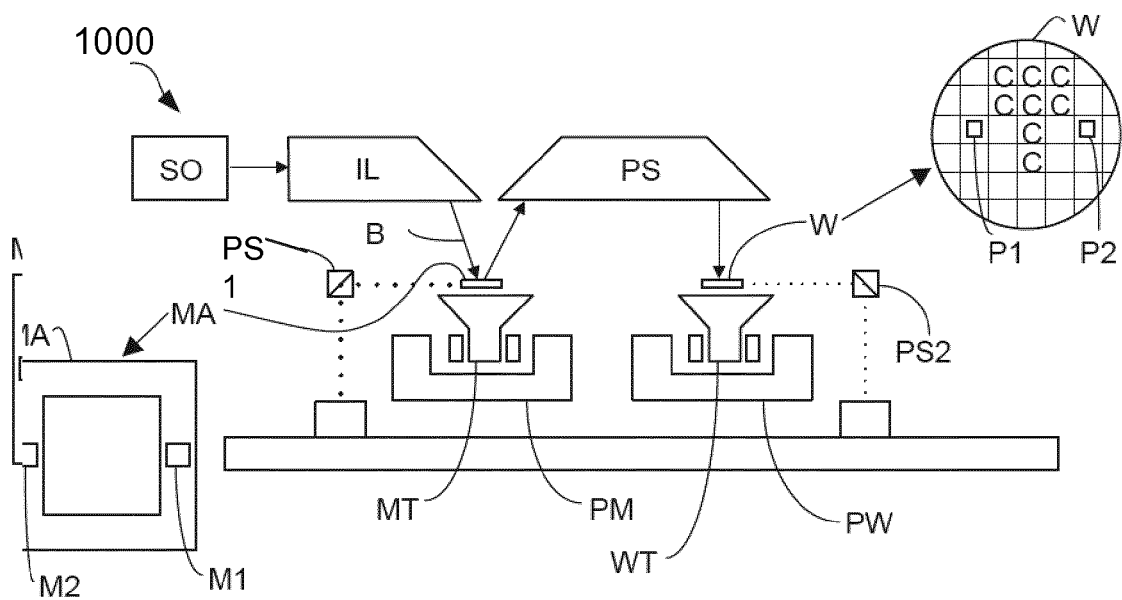
FIG. 9 is a schematic diagram of another lithographic projection apparatus.

FIG. 9 schematically depicts another exemplary lithographic projection apparatus 1000. The lithographic projection apparatus 1000 comprises:

a source collector module SO an illumination system (illuminator) IL configured to condition a radiation beam B (e.g. EUV radiation).

a support structure (e.g. a patterning device table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective patterning device). It is to be noted that because most materials are absorptive within the EUV wavelength range, the patterning device may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 9, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 9, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. patterning device table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. patterning device table) MT and the substrate table WT are scanned synchronously while a pattern imparted to the radiation beam is projected onto a target portion C (i.e. a single dynamic exposure). The velocity and direction of the substrate table WT relative to the support structure (e.g. patterning device table) MT may be determined by the (de-)magnification and image reversal characteristics of the projection system PS.

3. In another mode, the support structure (e.g. patterning device table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 10:
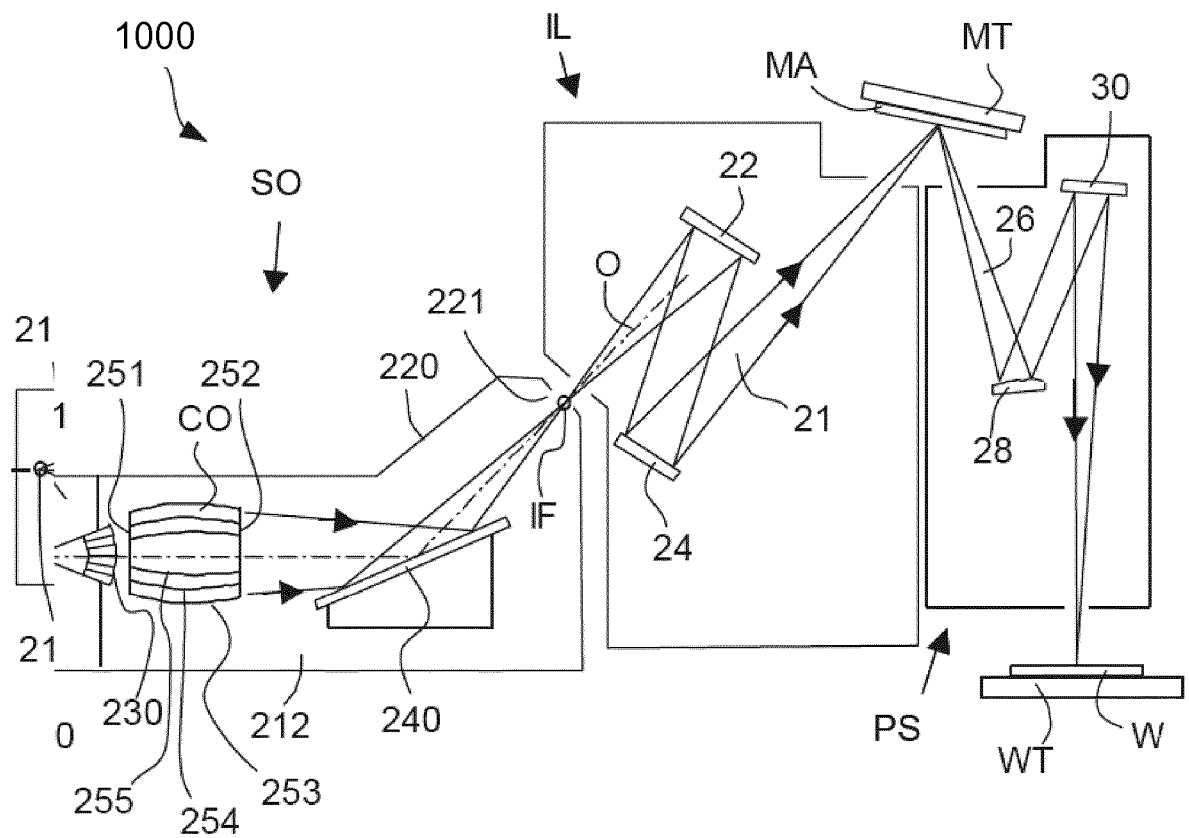
FIG. 10 is a more detailed view of the apparatus in FIG. 9.

FIG. 10 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field minor device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 10.

Collector optic CO, as illustrated in FIG. 10, is depicted as a nested collector with grazing incidence reflectors 253, 254 and 255, just as an example of a collector (or collector minor). The grazing incidence reflectors 253, 254 and 255 are disposed axially symmetric around the optical axis O and a collector optic CO of this type may be used in combination with a discharge produced plasma source, often called a DPP source.

Figure 11:
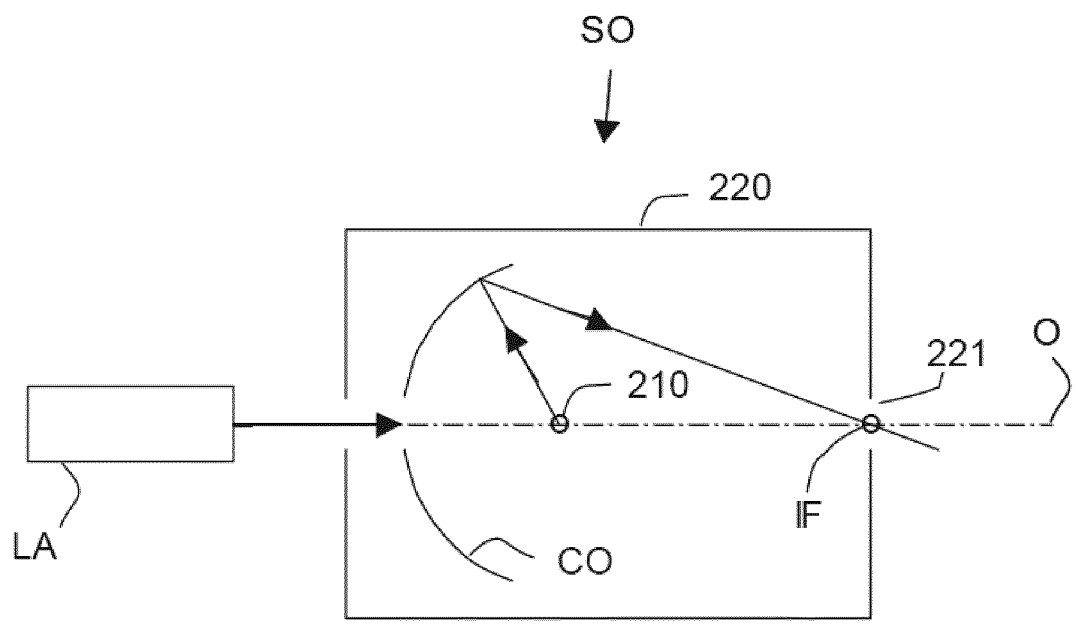
FIG. 11 is a more detailed view of the source collector module SO of the apparatus of FIG. 9 and
FIG. 10.

Alternatively, the source collector module SO may be part of an LPP radiation system as shown in FIG. 11. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

U.S. Patent Application Publication No. US 2013-0179847 is hereby incorporated by reference in its entirety.

The embodiments may further be described using the following clauses:

1. A method comprising:
obtaining a first measured characteristic which was obtained by measuring a first characteristic of an image physically produced on the substrate under each of a set of processing conditions or at each of a set of locations;
obtaining a first simulated characteristic by simulating the first characteristic under each of the set of processing conditions or at each of the set of locations using a first process model;
determining a deviation between the first measured characteristic and the first simulated characteristic for each of the set of locations or each of the set of processing conditions;
selecting, based on the deviations, a subset of locations from the set of locations or a subset of processing conditions from the set of processing conditions; and
adjusting the first process model using data from the subset of locations or under the subset of processing conditions, constructing a second process model using the data, adjusting a condition of a process of forming the image using the data, and/or inspecting for defects at a group of locations on the substrate determined based on the subset of locations or based on the subset of processing conditions.

2. A method comprising:
at each of a set of locations on a substrate, simulating a first characteristic of an image produced on the substrate using a first process model and using a second process model;
determining a deviation between the first characteristic simulated using the first process model and the first characteristic simulated using the second process model at each of the set of locations;
selecting, based on the deviations, a subset of locations from the set of locations;
adjusting the first process model using data from the subset of locations, constructing a third process model using the data, adjusting a condition of a process of forming the image using the data, and/or inspecting for defects at a group of locations on the substrate determined based on the subset of locations.

3. The method of claim 1 or claim 2, wherein the image is an aerial image.

4. The method of claim 1 or claim 2, wherein the image is a resist image.

5. The method of claim 1 or claim 2, wherein the image is an etched image.

6. The method of any of claims 1-5, wherein the first characteristic is a critical dimension.

7. The method of any of claims 1-5, wherein the first characteristic is a process window.

8. The method of any of claims 1-7, wherein simulating the first characteristic comprises using the condition.

9. The method of any of claims 1-8, wherein the deviations at the subset of locations are the highest among the deviations at the set of locations.

10. The method of any of claims 1-9, wherein the data comprise a condition of the process of forming the image and a second characteristic measured at the subset of locations.

11. The method of any of claims 1-10, wherein the condition comprises a characteristic of a patterning device used in forming the image.

12. The method of any of claims 1-11, wherein the condition comprises a characteristic of illumination used in forming the image or a characteristic of projection optics used in forming the image.

13. A computer program product comprising a non-transitory computer readable medium having instructions recorded thereon, the instructions when executed by a computer implementing a method of any of claims 1-12.

14. A substrate inspection system comprising:
a process model training module;
a control module; and
a simulation module,
wherein the process model training module is configured to receive data from a set of locations, and configured to receive a condition of a process of forming an image on a substrate from the control module,
wherein the process model training module is configured to construct or modify a first process model based on the data and the condition,
wherein the simulation module is configured to simulate characteristics of the image using the first process model, and configured to transmit the simulated characteristics to the control module,
wherein the control module is configured to determine deviations between the characteristics simulated using the first process model and the characteristics simulated using a second process model, and
wherein the control module is configured to, based on the deviations, adjust the condition, select a subset from the locations, cause inspection of the substrate, and/or cause the process model training module to construct or modify the first process model.

15. The substrate inspection system of claim 14, further comprising a condition adjustment module configured to adjust the condition, wherein the control module is configured to adjust the condition by the condition adjustment module.

16. A substrate inspection system comprising:
a process model training module;
a control module;
a simulation module; and
a measurement module,
wherein the process model training module is configured to receive data from a set of locations, and configured to receive a condition of a process of forming an image on a substrate from the control module,
wherein the process model training module is configured to construct or modify a process model based on the data and the condition,
wherein the simulation module is configured to simulate characteristics of the image using the process model, and configured to transmit the simulated characteristics to the control module,
wherein the control module is configured to determine deviations between the characteristics simulated using the process model and the characteristics measured on the substrate using the measurement module, and
wherein the control module is configured to, based on the deviations, adjust the condition, select a subset from the locations, cause inspection of the substrate, and/or cause the process model training module to construct or modify the process model.

17. The substrate inspection system of claim 16, wherein the measurement module comprises an optical microscope, a scanning probe microscope, or an electron scanning microscope.

18. The substrate inspection system of claim 16 or claim 17, further comprising a condition adjustment module configured to adjust the condition, wherein the control module is configured to adjust the condition by the condition adjustment module.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

What is claimed is:
1. A method comprising:
obtaining a first measured characteristic which was obtained by measuring a first characteristic of an image physically produced on the substrate under each processing condition of a set of processing conditions or at each location of a set of locations;
obtaining a first simulated characteristic by simulating, by a hardware computer, the first characteristic under each processing condition of the set of processing conditions or at each location of the set of locations using a first process model;
determining a deviation between the first measured characteristic and the first simulated characteristic for each location of the set of locations or each processing condition of the set of processing conditions;
selecting, based on the deviations, a subset of locations from the set of locations or a subset of processing conditions from the set of processing conditions; and
adjusting the first process model using data from the subset of locations or under the subset of processing conditions, constructing a second process model using the data, and/or inspecting for defects at a group of locations on the substrate determined based on the subset of locations or based on the subset of processing conditions.

2. The method of claim 1, wherein the image is an aerial image, a resist image or an etched image.

3. The method of claim 1, wherein the first characteristic is a critical dimension.

4. The method of claim 1, wherein the first characteristic is a process window.

5. The method of claim 1, wherein simulating the first characteristic comprises using the processing condition.

6. The method of claim 1, comprising determining a deviation between the first measured characteristic and the first simulated characteristic for each location of the set of locations and wherein the deviations at the subset of locations are the highest among the deviations at the set of locations.

7. The method of claim 1, wherein the data comprise a condition of the process of forming the image and a second characteristic measured at the subset of locations.

8. The method of claim 1, comprising adjusting a condition of a process of forming the image using the data and wherein the condition of the process comprises a characteristic of a patterning device used in forming the image.

9. The method of claim 1, comprising adjusting a condition of a process of forming the image using the data and wherein the condition of the process comprises a characteristic of illumination used in forming the image or a characteristic of projection optics used in forming the image.

10. A method comprising:
at each location of a set of locations on a substrate, simulating, by a hardware computer, a first characteristic of an image produced on the substrate using a first process model and using a second process model;
determining a deviation between the first characteristic simulated using the first process model and the first characteristic simulated using the second process model at each location of the set of locations;
selecting, based on the deviations, a subset of locations from the set of locations;
adjusting the first process model using data from the subset of locations, constructing a third process model using the data, adjusting a condition of a process of forming the image using the data, and/or inspecting for defects at a group of locations on the substrate determined based on the subset of locations.

11. The method of claim 10, wherein the image is an aerial image, a resist image or an etched image.

12. The method of claim 10, wherein the first characteristic is a critical dimension.

13. The method of claim 10, wherein the first characteristic is a process window.

14. The method of claim 10, wherein the deviations at the subset of locations are the highest among the deviations at the set of locations.

15. The method of claim 10, wherein the data comprise a condition of the process of forming the image and a second characteristic measured at the subset of locations.

16. The method of claim 10, comprising adjusting a condition of a process of forming the image using the data and wherein the condition of the process comprises a characteristic of a patterning device used in forming the image, a characteristic of illumination used in forming the image or a characteristic of projection optics used in forming the image.

17. A computer program product comprising a non-transitory computer readable medium having instructions therein, the instructions, upon execution by a computer system, configured to cause the computer system to at least:
obtain a first measured characteristic which was obtained by measuring a first characteristic of an image physically produced on the substrate under each processing condition of a set of processing conditions or at each location of a set of locations;
obtain a first simulated characteristic by simulating, by a hardware computer, the first characteristic under each processing condition of the set of processing conditions or at each location of the set of locations using a first process model;
determine a deviation between the first measured characteristic and the first simulated characteristic for each location of the set of locations or each processing condition of the set of processing conditions;
select, based on the deviations, a subset of locations from the set of locations or a subset of processing conditions from the set of processing conditions; and
adjust the first process model using data from the subset of locations or under the subset of processing conditions, construct a second process model using the data, and/or inspect for defects at a group of locations on the substrate determined based on the subset of locations or based on the subset of processing conditions.

18. A substrate inspection system comprising:
a process model training module;
a control module;
a simulation module; and
a measurement module,
wherein the process model training module is configured to receive data from a set of locations, and configured to receive a condition of a process of forming an image on a substrate from the control module,
wherein the process model training module is configured to construct or modify a process model based on the data and the condition,
wherein the simulation module is configured to simulate characteristics of the image using the process model, and configured to transmit the simulated characteristics to the control module,
wherein the control module is configured to determine deviations between the characteristics simulated using the process model and the characteristics measured on the substrate using the measurement module, and
wherein the control module is configured to, based on the deviations, select a subset from the locations and/or cause the process model training module to construct or modify the process model.

19. The substrate inspection system of claim 18, wherein the measurement module comprises an optical microscope, a scanning probe microscope, or an electron scanning microscope.

20. The substrate inspection system of claim 18, further comprising a condition adjustment module configured to adjust the condition, wherein the control module is configured to adjust the condition by the condition adjustment module.

21. A computer program product comprising a non-transitory computer readable medium having instructions therein, the instructions, upon execution by a computer system, configured to cause the computer system to at least:
at each location of a set of locations on a substrate, simulate a first characteristic of an image produced on the substrate using a first process model and using a second process model;
determine a deviation between the first characteristic simulated using the first process model and the first characteristic simulated using the second process model at each location of the set of locations; and
select, based on the deviations, a subset of locations from the set of locations;
adjust the first process model using data from the subset of locations, construct a third process model using the data, adjust a condition of a process of forming the image using the data, and/or inspect for defects at a group of locations on the substrate determined based on the subset of locations.

* * * * *